(12) United States Patent
Tagami et al.

(10) Patent No.: US 8,715,905 B2
(45) Date of Patent: May 6, 2014

(54) SILPHENYLENE-CONTAINING PHOTOCURABLE COMPOSITION, PATTERN FORMATION METHOD USING SAME, AND OPTICAL SEMICONDUCTOR ELEMENT OBTAINED USING THE METHOD

(71) Applicant: Shin-Etsu Chemical Co., Ltd., Chiyoda-ku (JP)

(72) Inventors: Shohei Tagami, Annaka (JP); Takato Sakurai, Annaka (JP); Hideto Kato, Annaka (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/019,910

(22) Filed: Sep. 6, 2013

(65) Prior Publication Data

US 2014/0011126 A1    Jan. 9, 2014

Related U.S. Application Data

(62) Division of application No. 13/163,174, filed on Jun. 17, 2011, now abandoned.

(30) Foreign Application Priority Data

Jun. 18, 2010 (JP) ................................. 2010-139535

(51) Int. Cl.
| | |
|---|---|
| *G03F 7/00* | (2006.01) |
| *G03F 7/004* | (2006.01) |
| *G03F 7/40* | (2006.01) |
| *G03F 7/028* | (2006.01) |

(52) U.S. Cl.
USPC ........ 430/270.1; 430/330; 430/331; 430/396; 430/280.1

(58) Field of Classification Search
USPC ........... 430/270.1, 280.1, 913, 322, 330, 331, 430/396
See application file for complete search history.

(56) References Cited

U.S. PATENT DOCUMENTS

| | | |
|---|---|---|
| 6,779,656 B2 | 8/2004 | Klettke et al. |
| 7,235,602 B2 | 6/2007 | Klettke et al. |
| 2005/0261390 A1 | 11/2005 | Frances et al. |

FOREIGN PATENT DOCUMENTS

| | | |
|---|---|---|
| EP | 0 447 926 A2 | 9/1991 |
| EP | 1 368 402 A1 | 12/2003 |

(Continued)

OTHER PUBLICATIONS

Extended European Search Report issued Oct. 25, 2011, in Patent Application No. 11004969.9.

(Continued)

*Primary Examiner* — Amanda C. Walke
(74) *Attorney, Agent, or Firm* — Oblon, Spivak, McClelland, Maier & Neustadt, L.L.P.

(57) ABSTRACT

Provided is a silphenylene-containing photocurable composition including: (A) a specific silphenylene having both terminals modified with alicyclic epoxy groups, and (C) a photoacid generator that generates acid upon irradiation with light having a wavelength of 240 to 500 nm. Also provided is a pattern formation method including: (i) forming a film of the photocurable composition on a substrate, (ii) exposing the film through a photomask with light having a wavelength of 240 to 500 nm, and if necessary, performing heating following the exposure, and (iii) developing the film in a developing liquid, and if necessary, performing post-curing at a temperature within a range from 120 to 300° C. following the developing. Further provided is an optical semiconductor element obtained by performing pattern formation using the method. The composition is capable of very fine pattern formation across a broad range of wavelengths, and following pattern formation, yields a film that exhibits a high degree of transparency and superior light resistance. The composition may also include: (B) a specific epoxy group-containing organosilicon compound.

6 Claims, 1 Drawing Sheet

(56) References Cited

FOREIGN PATENT DOCUMENTS

| | | |
|---|---|---|
| JP | 4-222815 A | 8/1992 |
| JP | 2003-519705 A | 6/2003 |
| JP | 2007-537210 A | 12/2007 |
| WO | WO 01/51540 | 7/2001 |
| WO | WO 02/066535 A1 | 8/2002 |
| WO | WO 2009/104680 A1 | 8/2009 |

OTHER PUBLICATIONS

J. V. Crivello, et al., "The Synthesis and Cationic Polymerization of Multifunctional Silicon-Containing Epoxy Monomers and Oligomers", Journal of Polymer Science, Polymer Chemistry Edition, vol. 32, Part A, No. 4, XP 2025640, Mar. 1994, pp. 683-697.

Japanese Office Action issued Jan. 29, 2013 in Patent Application No. 2010-139535 with English Translation.

Notification of Grounds for Rejection issued on Apr. 9, 2013 in the corresponding Japanese Application No. JP2010-139535 (with English Translation).

European Office Action Issued May 2, 2013 in Patent Application No. 11 004 969.9.

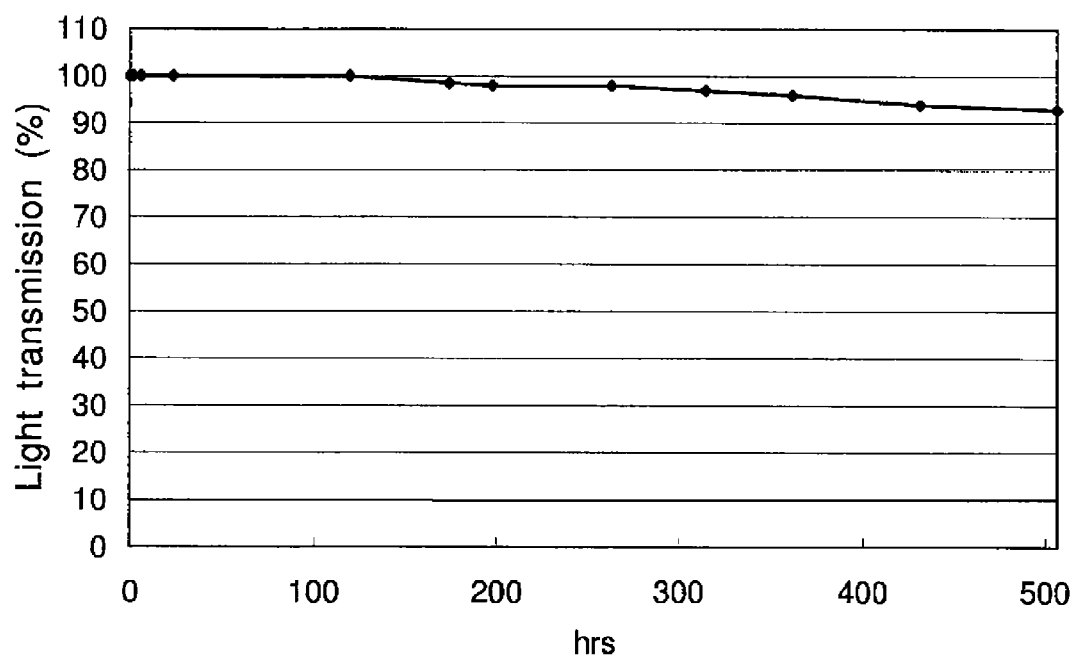

SILPHENYLENE-CONTAINING PHOTOCURABLE COMPOSITION, PATTERN FORMATION METHOD USING SAME, AND OPTICAL SEMICONDUCTOR ELEMENT OBTAINED USING THE METHOD

CROSS REFERENCES TO RELATED APPLICATIONS

This application is a Divisional Application of U.S. patent application Ser. No. 13/163,174, filed on Jun. 17, 2011, and claims priority to Japanese Patent Application No. 2010-139535, filed on Jun. 18, 2010.

BACKGROUND OF THE INVENTION

1. Field of the Invention

The present invention relates to a silphenylene-containing photocurable composition, a pattern formation method that uses the composition, and an optical semiconductor element obtained using the method. The invention relates particularly to a silphenylene-containing photocurable composition which, due to its superior properties of transparency, light resistance and heat resistance, is useful in optical devices typified by light-emitting elements such as light-emitting diodes (LED), light-receiving elements such as photodiodes, optical sensors and CMOS image sensors, and optical transmission devices such as optical waveguides, as well as a pattern formation method that uses the silphenylene-containing photocurable composition, and an optical semiconductor element obtained using the method.

2. Description of the Prior Art

Epoxy resins have typically been used as the encapsulating protective material within various optical devices typified by LEDs and CMOS image sensors. Among such resins, a large number of epoxy-modified silicone resins have been used due to their high levels of transparency and light resistance, and resins in which alicyclic epoxy groups have been introduced into a silphenylene backbone also exist (see Patent Document 1). However, these resins are not capable of undergoing microfabrication in the order of 10 μm. Nowadays, many types of optical devices require microfabrication. When this type of microfabrication is required, resist materials typified by epoxy resin-based materials have often been used, but these resist materials tend to have inadequate light resistance, meaning although there may be no problems with devices of low light intensity, devices that use a stronger light intensity have tended to suffer from problems such as gas emission and discoloration.

[Patent Document 1] EP 0 447 926 A2

SUMMARY OF THE INVENTION

The present invention has been developed in light of the above circumstances, and has an object of providing a silphenylene-containing photocurable composition that is capable of very fine pattern formation across a broad range of wavelengths, and following pattern formation, yields a film that exhibits a high degree of transparency and superior light resistance, as well as providing a pattern formation method that uses the silphenylene-containing photocurable composition, and an optical semiconductor element that is obtained using the pattern formation method.

As a result of intensive investigation aimed at achieving the above object, the inventors of the present invention discovered that a photocurable composition described below, comprising a specific alicyclic epoxy-modified silphenylene compound, could be exposed with light across a broad range of wavelengths, enabling ready formation of a cured product with no oxygen inhibition. They also discovered that the pattern formation method described below enabled the formation of very fine patterns, and that optical semiconductor elements produced using the above-mentioned photocurable composition and pattern formation method exhibited excellent transparency and light resistance, and they were therefore able to complete the present invention.

In other words, a first aspect of the present invention provides a silphenylene-containing photocurable composition comprising:

(A) a silphenylene having both terminals modified with alicyclic epoxy groups, represented by formula (1) shown below, and

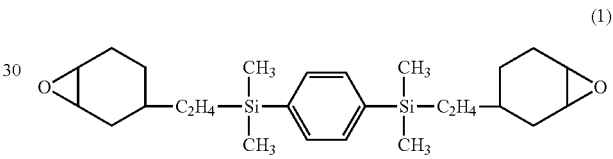

(C) a photoacid generator that generates acid upon irradiation with light having a wavelength of 240 to 500 nm.

If necessary, the photocurable composition may further comprise:

(B) an epoxy group-containing organosilicon compound represented by general formula (2) shown below:

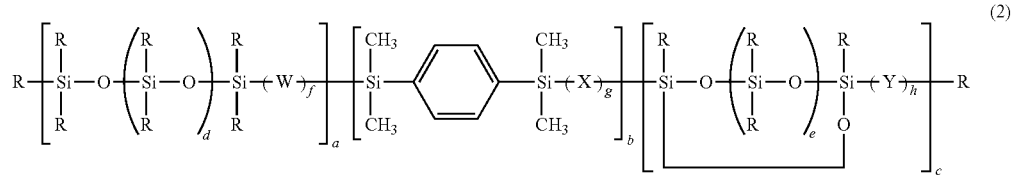

(wherein each R independently represents a hydrogen atom or a monovalent organic group, at least one R comprises an epoxy group, a, b and c each represents an integer of 0 or greater, d represents an integer of 0 or greater, e represents an integer of 1 or greater, W, X and Y each represents a divalent organic group, and f, g and h each independently represents 0 or 1, provided that when a and c are 0, b is 1 and g is 0, the R groups do not both represent epoxy group-containing organic groups represented by the formula below).

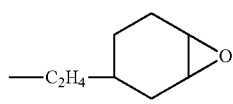

A second aspect of the present invention provides a cured film obtained by curing the above photocurable composition.

A third aspect of the present invention provides a pattern formation method comprising:

(i) forming a film of the above-mentioned photocurable composition on a substrate, (ii) exposing the film through a photomask with light having a wavelength of 240 to 500 nm, or exposing the film through a photomask with light having a wavelength of 240 to 500 nm and then performing heating following the exposure, and (iii) developing the film in a developing liquid, or developing the film in a developing liquid and subsequently performing post-curing at a temperature within a range from 120 to 300° C.

A fourth aspect of the present invention provides an optical semiconductor element obtained by performing pattern formation using the method described above.

A fifth aspect of the present invention provides use of the above-mentioned photocurable composition for pattern formation.

By using the photocurable composition of the present invention comprising a specific alicyclic epoxy-modified silphenylene compound, exposure can be performed with light across a broad range of wavelengths, and thin films can be formed readily with no oxygen inhibition. Further, very fine patterns of 10 μm or less can be formed, and the cured films obtained from the composition exhibit excellent transparency, light resistance and heat resistance, meaning they can be used favorably for protecting and encapsulating optical devices and the like.

BRIEF DESCRIPTION OF THE DRAWINGS

FIG. 1 is a graph illustrating the results of investigating the change over time in the light transmission of a sample of Example 5 composed of a cured film sandwiched between glass wafers, wherein the initial transmission was deemed to be 100%.

DETAILED DESCRIPTION OF THE PREFERRED EMBODIMENTS

A more detailed description of the present invention is presented below.

[Component (A)]

The component (A) is a silphenylene having both terminals modified with alicyclic epoxy groups, represented by formula (1) shown above. The component (A) can be produced, for example as described below in Synthesis Example 1, by subjecting a 2/1 molar ratio of 1,2-epoxy-4-vinylcyclohexane and 1,4-bis(dimethylsilyl)benzene to a hydrosilylation reaction using normal methods.

[Component (B)]

The component (B) is an epoxy group-containing organosilicon compound represented by general formula (2) shown above. The component (B) is an optional component, and may be either included or not included in the photocurable composition of the present invention. The component (B) may be either a single compound or a combination of two or more different compounds.

In general formula (2), each R independently represents a hydrogen atom or a monovalent organic group, and at least one R group, and preferably 20 mol % or more of the R groups, comprise an epoxy group. If the general formula (2) does not include a single R group that comprises an epoxy group, then cross-linking between the component (A) and the component (B) does not proceed. The R groups may be the same or different.

Examples of R include a hydrogen atom, monovalent hydrocarbon groups of 1 to 8 carbon atoms, and epoxy group-containing organic groups represented by the formulas shown below.

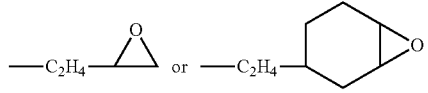

Specific examples of the monovalent hydrocarbon groups of 1 to 8 carbon atoms for R include alkyl groups such as a methyl group, ethyl group, propyl group, butyl group, pentyl group or hexyl group, cycloalkyl groups such as a cyclopentyl group or cyclohexyl group, aryl groups such as a phenyl group, and aralkyl groups such as a benzyl group or phenethyl group. From the viewpoint of ease of availability of the raw material, a methyl group, ethyl group or phenyl group is preferred. Appropriate selection of R from the various possibilities mentioned above makes it easier to achieve a combination of favorable transparency and superior pattern formability.

In general formula (2), a, b and c each represents an integer of 0 or greater. Although there are no particular limitations on a, provided it is an integer of 0 or greater, an integer of 0 to 10 is typical. Further, although there are no particular limitations on b, provided it is an integer of 0 or greater, an integer of 0 to 10 is typical. Similarly, although there are no particular limitations on c, provided it is an integer of 0 or greater, an integer of 0 to 10 is typical. The repeating units to which a, b and c are appended need not necessarily be linked continuously, and need not necessarily be linked in the sequence shown in the above formula, meaning the repeating units may be linked in a random order. In those cases where a, b or c is 2 or greater, indicating a plurality of the corresponding repeating unit, the plurality of repeating units may be the same or different.

In general formula (2), d represents an integer of 0 or greater, and e represents an integer of 1 or greater. Although there are no particular limitations on d, provided it is an integer of 0 or greater, an integer of 0 to 15 is typical. Further, although there are no particular limitations on e, provided it is an integer of 1 or greater, an integer of 1 to 8 is typical.

In general formula (2), W, X and Y represent divalent organic groups. Each of W, X and Y may represent one type of group or a plurality of different groups. W, X and Y preferably represent divalent organic groups represented by general formula (3) shown below:

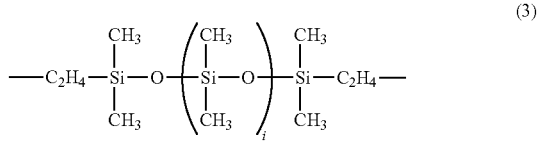

(wherein i represents an integer of 0 to 10).

The divalent organic groups represented by general formula (3) above are produced, for example, by using the corresponding linear dimethylsiloxane having vinyl groups at both terminals as a raw material.

In general formula (3), i represents an integer of 0 to 10, but is typically an integer of 0 or 1.

In the above general formula (2), f, g and h each represents 0 or 1. In those cases where one of the repeating units to which the subscript a is appended is positioned at the right terminal in general formula (2), f is preferably 0, but when the same unit is positioned at a location other than the right terminal in general formula (2), f is preferably 1. Similarly, in those cases where one of the repeating units to which the subscript b is appended is positioned at the right terminal in general formula (2), g is preferably 0, but when the same unit is positioned at a location other than the right terminal in general formula (2), g is preferably 1. Moreover, in a similar manner, in those cases where one of the repeating units to which the subscript c is appended is positioned at the right terminal in general formula (2), h is preferably 0, but when the same unit is positioned at a location other than the right terminal in general formula (2), h is preferably 1.

As is clear from the provision mentioned in the description immediately following the general formula (2) shown above, the component (B) and the component (A) do not represent identical compounds.

Specific examples of the component (B) include the epoxy group-containing organosilicon compounds represented by general formula (2') shown below:

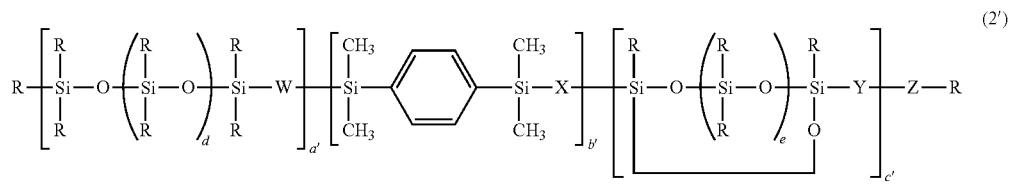

(wherein a', b' and c' each represents an integer of 0 or greater, R, d, e, W, X and Y are the same as defined above, and Z represents a divalent organic group represented by one of the formulas shown below:

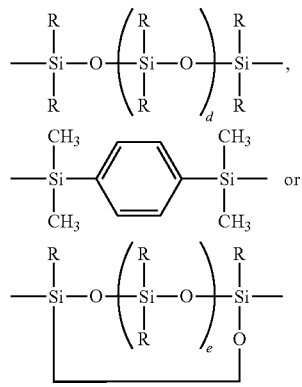

(wherein R, d and e are the same as defined above), provided that when a', b' and c' are 0 and Z is a divalent organic group represented by the formula shown below:

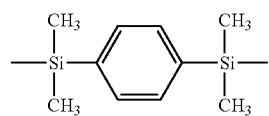

the R groups do not both represent epoxy group-containing organic groups represented by the formula below).

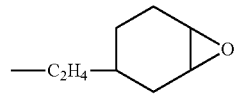

In the above general formula (2'), the divalent organic group represented by Z is produced, for example, by using the equivalent SiH group-containing organosilicon compound that includes an additional two hydrogen atoms on the divalent organic group (namely, the compound that includes silicon atom-bonded hydrogen atoms at both terminals) as a raw material.

Specific examples of the component (B) include the structures shown below.

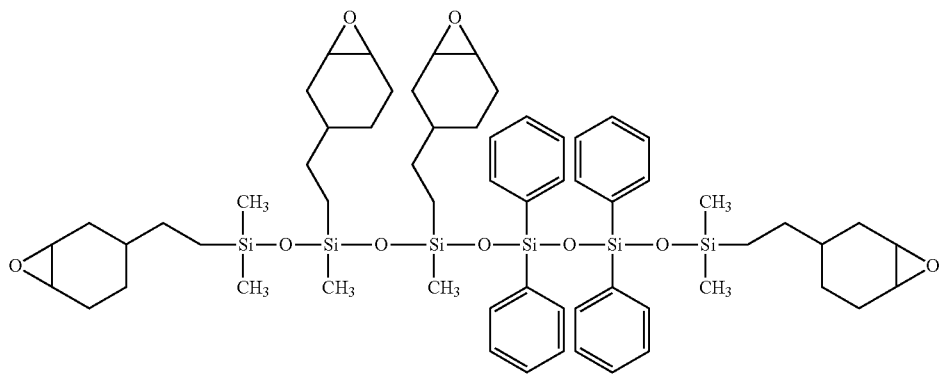

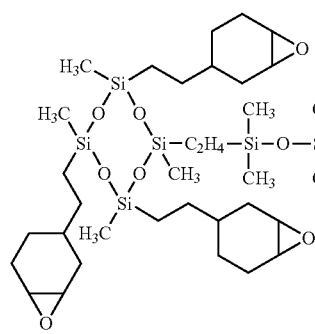
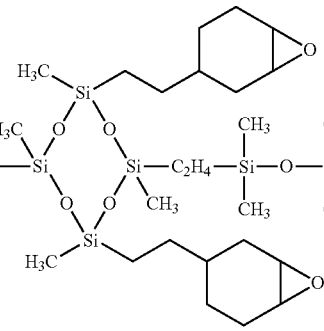
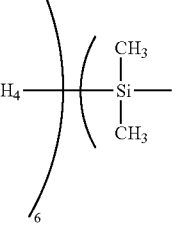
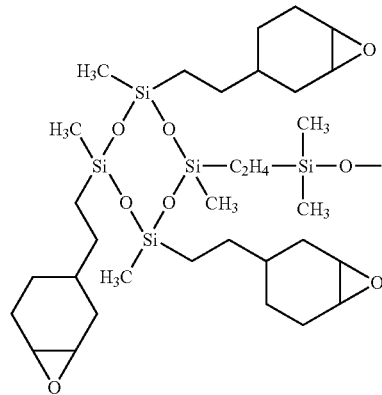
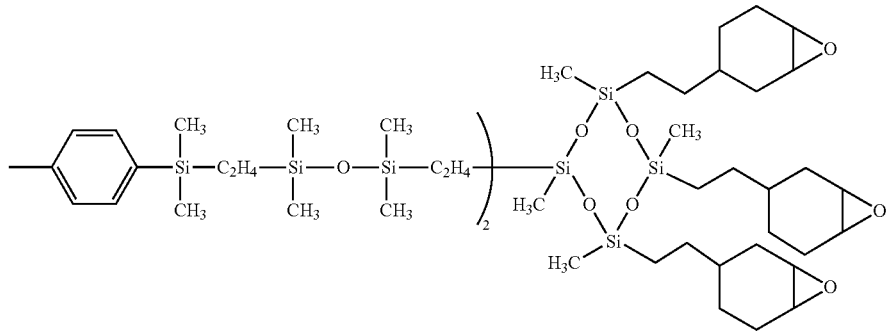

Adding the component (B) facilitates regulation of the viscosity of the resulting composition, making it easier to achieve the required film thickness and effectively improving the flexibility of the resulting cured product.

The amount added of the component (B) is preferably within a range from 0.5 to 900 parts by mass, and more preferably from 10 to 200 parts by mass, per 100 parts by mass of the component (A). Provided the amount of the component (B) satisfies this range from 0.5 to 900 parts by mass, the effect of including the component (B) can be achieved satisfactorily, while maintaining good compatibility between the epoxy group-containing organosilicon compound of the component (B) and the photoacid generator of the component (C). The component (B) is not necessarily limited to a single compound, and a plurality of different compounds may also be used in combination.

The component (B) can be produced, for example, by mixing together appropriate amounts of vinyl group-containing compounds and SiH group-containing organosilicon compounds corresponding with each of the portions of the component (B), and then performing a hydrosilylation reaction in accordance with normal methods.

[Component (C)]

The component (C) is a photoacid generator that generates acid upon irradiation with light having a wavelength of 240 to 500 nm, and is used as a curing catalyst. Examples of this type of photoacid generator include onium salts, diazomethane derivatives, glyoxime derivatives, β-ketosulfone derivatives, disulfone derivatives, nitrobenzyl sulfonate derivatives, sulfonate ester derivatives, imidoyl sulfonate derivatives, oxime sulfonate derivatives, iminosulfonate derivatives and triazine derivatives.

Examples of the above-mentioned onium salts include compounds represented by general formula (4) shown below.

$$(R^1)_h M^+ K^- \quad (4)$$

(wherein $R^1$ represents a linear, branched or cyclic alkyl group of 1 to 12 carbon atoms, an aryl group of 6 to 12 carbon atoms or an aralkyl group of 7 to 12 carbon atoms, which may have a substituent, $M^+$ represents an iodonium or sulfonium ion, $K^-$ represents a non-nucleophilic counter ion, and h represents 2 or 3.)

Examples of the alkyl group for $R^1$ include a methyl group, ethyl group, propyl group, butyl group, cyclohexyl group, 2-oxocyclohexyl group, norbornyl group or adamantyl group. Examples of the aryl group for $R^1$ include alkoxyphenyl groups such as an o-, m- or p-methoxyphenyl group, ethoxyphenyl group, or m- or p-tert-butoxyphenyl group, and alkylphenyl groups such as a 2-, 3- or 4-methylphenyl group, ethylphenyl group, 4-tert-butylphenyl group, 4-butylphenyl group or dimethylphenyl group. Further, examples of the aralkyl group for $R^1$ include a benzyl group or phenethyl group.

Examples of the non-nucleophilic counter-ion represented by $K^-$ include halide ions such as a chloride ion or bromide ion, fluoroalkylsulfonate ions such as triflate, 1,1,1-trifluoroethanesulfonate and nonafluorobutanesulfonate ions, arylsulfonate ions such as tosylate, benzenesulfonate, 4-fluorobenzenesulfonate and 1,2,3,4,5-pentafluorobenzenesulfonate ions, alkylsulfonate ions such as mesylate and butanesulfonate ions, as well as a hexafluorophosphate ion and fluorinated alkylfluorophosphate ions.

Examples of the above-mentioned diazomethane derivatives include compounds represented by general formula (5) shown below.

(5)

(wherein the $R^2$ groups may be the same or different, and each represents a linear, branched or cyclic alkyl group or halogenated alkyl group of 1 to 12 carbon atoms, an aryl group or halogenated aryl group of 6 to 12 carbon atoms, or an aralkyl group of 7 to 12 carbon atoms.)

Examples of the alkyl group for $R^2$ include a methyl group, ethyl group, propyl group, butyl group, amyl group, cyclopentyl group, cyclohexyl group, norbornyl group or adamantyl group. Examples of the halogenated alkyl group for $R^2$ include a trifluoromethyl group, 1,1,1-trifluoroethyl group, 1,1,1-trichloroethyl group or nonafluorobutyl group. Examples of the aryl group for $R^2$ include a phenyl group, alkoxyphenyl groups such as an o-, m- or p-methoxyphenyl group, ethoxyphenyl group, or m- or p-tert-butoxyphenyl group, and alkylphenyl groups such as a 2-, 3- or 4-methylphenyl group, ethylphenyl group, 4-tert-butylphenyl group, 4-butylphenyl group or dimethylphenyl group. Examples of the halogenated aryl group for $R^2$ include a fluorophenyl group, chlorophenyl group or 1,2,3,4,5-pentafluorophenyl group. Examples of the aralkyl group for $R^2$ include a benzyl group or phenethyl group.

Examples of the above-mentioned glyoxime derivatives include compounds represented by general formula (6) shown below.

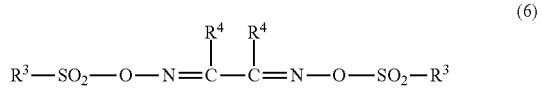

(6)

(wherein the $R^3$ groups and the $R^4$ groups may be the same or different, and each represents a linear, branched or cyclic alkyl group or halogenated alkyl group of 1 to 12 carbon atoms, an aryl group or halogenated aryl group of 6 to 12 carbon atoms, or an aralkyl group of 7 to 12 carbon atoms. Further, the $R^4$ groups may be bonded together to form a cyclic structure, and in those cases where such a cyclic structure is formed, $R^4$ represents a linear or branched alkylene group of 1 to 6 carbon atoms.)

Examples of the alkyl group, halogenated alkyl group, aryl group, halogenated aryl group or aralkyl group for $R^3$ and $R^4$ include the same groups as those exemplified above for $R^2$. Examples of the alkylene group for $R^4$ include a methylene group, ethylene group, propylene group, butylene group or hexylene group.

Specific examples of the photoacid generator on the component (C) include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, and diphenyl(4-thiophenoxyphenyl)sulfonium hexafluoroantimonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

oxime sulfonate derivatives such as α-(benzenesulfoniumoxyimino)-4-methylphenylacetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Other examples include iminosulfonate derivatives such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile. Of the above photoacid generators, the use of an onium salt or a sulfonium salt-based derivative is particularly desirable.

As the component (C), a single compound may be used alone, or two or more different compounds may be mixed. The amount added of the component (C) is preferably within a range from 0.05 to 20 parts by mass, more preferably from 0.2 to 5 parts by mass, and still more preferably 0.5 to 2 parts by mass, per 100 parts by mass of the component (A) or per 100 parts by mass of the combination of the component (A) and the component (B). Provided the amount of the component (C) satisfies this range from 0.05 to 20 parts by mass, satisfactory photocuring properties can be readily achieved, and the problem wherein the acid generator itself absorbs light, causing a deterioration in the curing properties within thick films, can be effectively prevented. Further, in order to achieve the superior levels of transparency and light resistance that represent features of a product of the present invention, the amount of a photoacid generator of the component (C) that exhibits light absorption is preferably at the lower end of the range that yields favorable photocuring.

[Component (D)]

The photocurable composition of the present invention may also contain an organic solvent as a component (D) according to need. The organic solvent is preferably a solvent that is capable of dissolving the silphenylene having both terminals modified with alicyclic epoxy groups of the component (A), the epoxy group-containing organosilicon compound of the component (B), and the photoacid generator of the component (C) and the like. The component (D) may be either a single solvent or a combination of two or more different solvents.

Examples of the organic solvent of the component (D) include ketones such as cyclohexanone, cyclopentanone and methyl 2-n-amyl ketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether, esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate and γ-butyrolactone, and amides such as N-methyl-2-pyrrolidone and N,N-dimethylacetamide. Of these, those solvents that exhibit superior solubility of the photoacid generator, including cyclohexanone, cyclopentanone, propylene glycol monomethyl ether, propylene glycol monomethyl ether acetate, or a mixed solvent containing two or more of these solvents are particularly preferred.

The amount used of the organic solvent of the component (D) is typically within a range from 1 to 2,000 parts by mass, and preferably from 20 to 1,000 parts by mass, per 100 parts by mass of the combination of the component (A) and the component (C) or per 100 parts by mass of the combination of the components (A), (B) and (C). Provided the amount of the organic solvent satisfies this range from 1 to 2,000 parts by mass, favorable co-solubility can be achieved for the component (A) and the component (C), or the components (A), (B) and (C), and the viscosity of the resulting solution is not too low, thereby facilitating application of the resulting composition.

[Other Added Components]

In addition to each of the components described above, the photocurable composition of the present invention may also include other added components. Examples of these other added components include antioxidants such as hindered amines and hindered phenols. These compounds may be included in amounts that do not impair the transparency of the cured product.

Other possible added components include organosiloxanes besides the component (A) and the component (B). These other organosiloxanes can be added for purposes such as improving the adhesion of the composition, regulating the viscosity of the solution, and improving the workability during pattern formation. These compounds may be included in amounts that do not impair the pattern formability, do not inhibit the photocurability, and cause no deterioration in the transparency.

[Composition Production Method]

Preparation of the photocurable composition of the present invention may be performed using typical methods. For example, the photocurable composition of the present invention can be prepared by mixing the above-mentioned component (A) and the component (C), together with the component (B), the component (D) and any other added components as required, stirring the resulting mixture, and then, if required, performing a filtration through a filter or the like to remove any solid fraction.

[Pattern Formation Method]

The pattern formation method of the present invention uses the photocurable composition described above, and comprises:

(i) forming a film of the above-mentioned photocurable composition on a substrate by application of the composition or by another appropriate method, (ii) exposing the film through a photomask with light having a wavelength of 240 to 500 nm, and if necessary, performing heating following the exposure (so-called post-exposure baking or PEB), and (iii) developing the film in a developing liquid, and if necessary, performing post-curing at a temperature within a range from 120 to 300° C. following the developing (so-called hard-baking). This method enables the production of a very fine pattern.

In the pattern formation method of the present invention, the above-mentioned photocurable composition is first applied to a substrate. Examples of the substrate include a silicon wafer, glass wafer or quartz wafer, or a plastic circuit board or ceramic circuit board.

Conventional lithography techniques may be employed for the application method. For example, the composition can be applied using techniques such as dip coating, spin coating or roll coating. The amount of composition applied may be selected appropriately in accordance with the intended purpose, but the amount is usually determined so as to achieve a film thickness of 0.1 to 100 µm.

At this point, in order to ensure an effective photocuring reaction, preliminary heating may be performed if necessary to volatilize the solvent or the like. This preliminary heating is typically performed by heating at 40 to 140° C. for a period of approximately one minute to one hour. Subsequently, the film is exposed through a photomask with light having a wavelength of 240 to 500 nm, thereby curing the film. The photomask may include a desired pattern cut therein. The material of the photomask preferably blocks the above light having a wavelength of 240 to 500 nm, and a material such as chrome can be used favorably, although the present invention is not limited to such materials.

Examples of the above-mentioned light having a wavelength of 240 to 500 nm include lights of various wavelengths generated by appropriate radiation-generating devices, including ultraviolet light such as g-line and i-line radiation, and far ultraviolet light (248 nm). The exposure dose is preferably within a range from 10 to 5,000 mJ/cm$^2$. If necessary, a heating treatment may be performed following the exposure in order to improve the developing sensitivity. This post-exposure heating treatment is typically conducted at a temperature of 40 to 140° C. for a period of 0.5 to 10 minutes.

Following the exposure, or following the post-exposure heat treatment, the film is developed in a developing liquid. An organic solvent-based developing liquid is preferably used as the developing liquid, and specific examples of preferred solvents include isopropyl alcohol, propylene glycol monomethyl ether and propylene glycol monomethyl ether acetate. The developing may be performed using a typical method, for example, by dipping the pattern-formed structure into the developing liquid. Subsequently, the film is washed, rinsed and dried as required, yielding a cured film having the desired pattern formed therein. The pattern formation method is as described above, but in those cases where a pattern need not be formed, namely in those cases where a simple uniform film is to be formed, the method may be conducted in the same manner as the pattern formation method described above, with the exception of not using the above-mentioned photomask. Furthermore, if necessary, the resulting pattern may be heated in an oven or on a hotplate at 120 to 300° C. for a period of approximately 10 minutes to 10 hours in order to increase the cross-linking density and remove any residual volatile components (so-called post-curing).

[Optical Semiconductor Element]

By forming a very fine pattern from the photocurable composition using the method described above, an optical semiconductor element having superior transparency, light resistance and heat resistance can be obtained. The cured film obtained from the photocurable composition in the manner described above exhibits excellent levels of transparency, light resistance and heat resistance, and an optical semiconductor element obtained by forming a fine pattern from this cured film can be used favorably in optical devices such as light-emitting elements, light-receiving elements and optical transmission devices.

EXAMPLES

The present invention is described below in further detail based on a series of synthesis examples and examples, although the present invention is in no way limited by the examples presented below.

Synthesis Example 1

A flask fitted with a stirrer and a thermometer was charged with 49.7 g (0.4 mols) of 1,2-epoxy-4-vinylcyclohexane, 500 g of toluene and 0.5 g of a 2% by mass ethanol solution of chloroplatinic acid, and with the flask contents undergoing constant stirring, the flask was heated using an oil bath until the internal temperature reached 70° C. Subsequently, 38.9 g (0.2 mols) of 1,4-bis(dimethylsilyl)benzene was added dropwise to the flask over a period of 20 minutes. Following completion of the dropwise addition, the reaction mixture was stirred for 3 hours at 90° C. Following completion of the reaction, the reaction liquid was subjected to a distillation treatment under heating and reduced pressure (50° C., 1 mmHg) using a rotary evaporator until no further distillate was produced, thus yielding 85 g of a silphenylene (A-1) having both terminals modified with alicyclic epoxy groups that represents the component (A).

Synthesis Example 2

A flask fitted with a stirrer and a thermometer was charged with 49.7 g (0.4 mols) of 1,2-epoxy-4-vinylcyclohexane, 500 g of toluene and 0.5 g of a 2% by mass ethanol solution of chloroplatinic acid, and with the flask contents undergoing constant stirring, the flask was heated using an oil bath until the internal temperature reached 70° C. Subsequently, 65.1 g (0.1 mols) of an organosiloxane having an average structure represented by formula (7) shown below was added dropwise to the flask over a period of 20 minutes. Following completion of the dropwise addition, the reaction mixture was stirred for 3 hours at 90° C. Following completion of the reaction, the reaction liquid was subjected to a distillation treatment under heating and reduced pressure (50° C., 1 mmHg) using a rotary evaporator until no further distillate was produced, thus yielding 110 g of an epoxy-modified siloxane compound (B-1) having an average structure represented by formula (8) shown below.

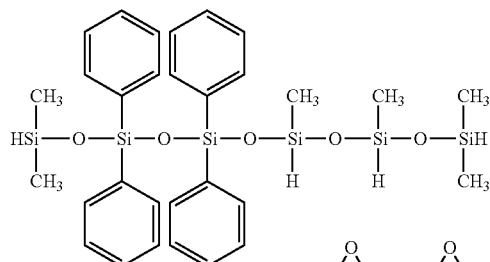

(7)

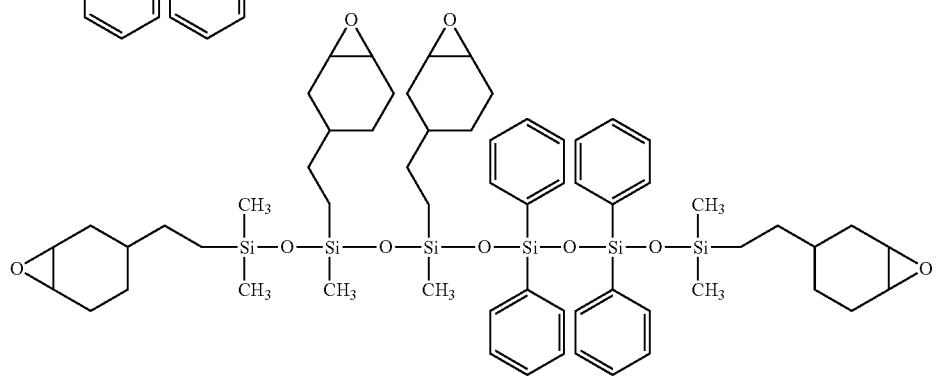

(8)

Synthesis Example 3

A flask fitted with a stirrer and a thermometer was charged with 27.3 g (0.22 mols) of 1,2-epoxy-4-vinylcyclohexane, 16.8 g (0.09 mols) of 1,3-divinyl-1,1,3,3-tetramethylpropanedisiloxane, 500 g of toluene and 0.5 g of a 2% by mass ethanol solution of chloroplatinic acid, and with the flask contents undergoing constant stirring, the flask was heated using an oil bath until the internal temperature reached 70° C. Subsequently, 24.1 g (0.1 mols) of 1,3,5,7-tetramethylcyclotetrasiloxane was added dropwise to the flask over a period of 20 minutes. Following completion of the dropwise addition, the reaction mixture was stirred for 3 hours at 90° C. Following completion of the reaction, the reaction liquid was subjected to a distillation treatment under heating and reduced pressure (50° C., 1 mmHg) using a rotary evaporator until no further distillate was produced, thus yielding 65 g of an epoxy-modified siloxane compound (B-2) having an average structure represented by formula (9) shown below.

16.8 g (0.09 mols) of 1,3-divinyl-1,1,3,3-tetramethylpropanedisiloxane, 500 g of toluene and 0.5 g of a 2% by mass ethanol solution of chloroplatinic acid, and with the flask contents undergoing constant stirring, the flask was heated using an oil bath until the internal temperature reached 70° C. Subsequently, 19.2 g (0.08 mols) of 1,3,5,7-tetramethylcyclotetrasiloxane and 3.9 g (0.02 mols) of 1,4-bis(dimethylsilyl)benzene were added dropwise to the flask over a period of 20 minutes. Following completion of the dropwise addition, the reaction mixture was stirred for 3 hours at 90° C. Following completion of the reaction, the reaction liquid was subjected to a distillation treatment under heating and reduced pressure (50° C., 1 mmHg) using a rotary evaporator until no further distillate was produced, thus yielding 60 g of an epoxy-modified siloxane compound (B-3) having an average structure represented by formula (10) shown below.

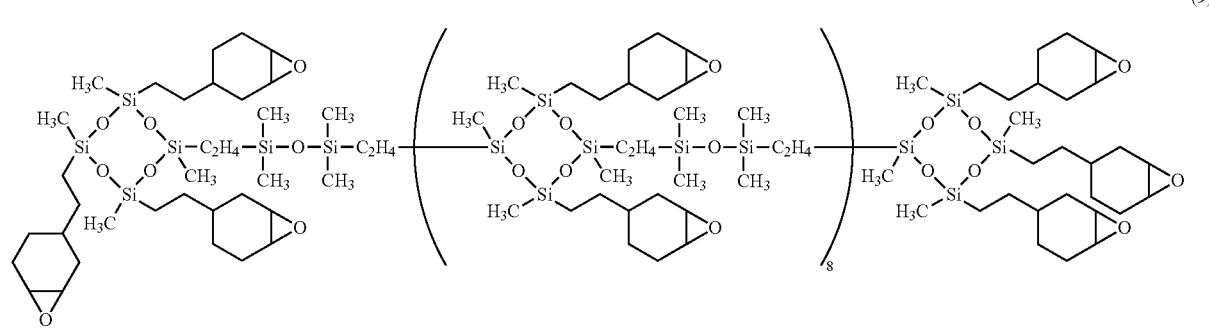

(9)

Synthesis Example 4

A flask fitted with a stirrer and a thermometer was charged with 22.4 g (0.18 mols) of 1,2-epoxy-4-vinylcyclohexane,

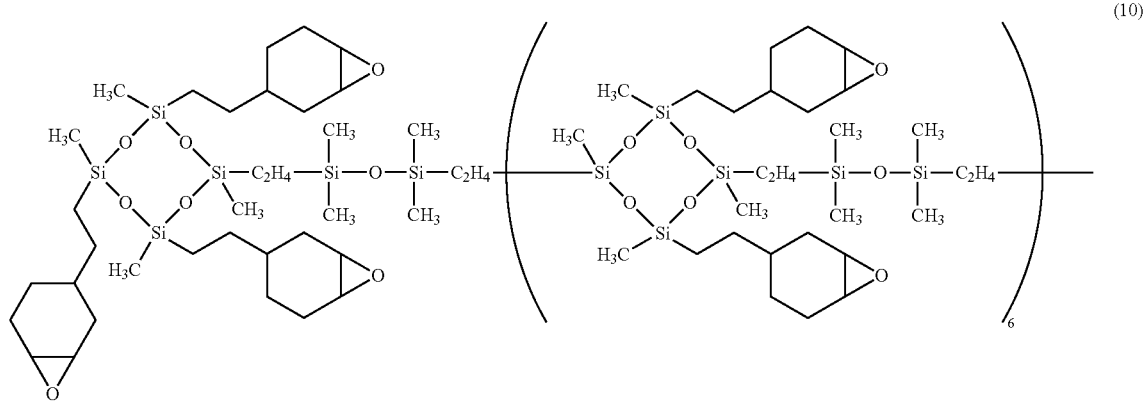

(10)

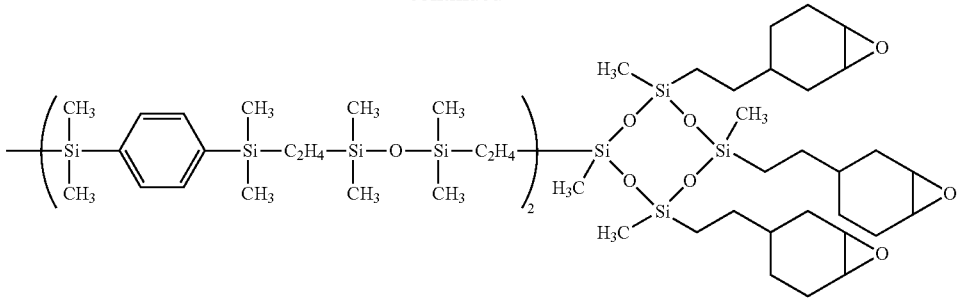

Examples 1 to 4

Using the silphenylene having both terminals modified with alicyclic epoxy groups that was synthesized in Synthesis Example 1 as the component (A) and the epoxy-modified siloxane compounds synthesized in Synthesis Examples 2 to 4 as the component (B), the components (A) and (B) were combined with a photoacid generator of the component (C), a solvent of the component (D) and other additives using the formulations listed below in Table 1 (the units for the numerical values represent "parts by mass"). Each of the resulting mixtures was stirred and dissolved, and then subjected to microfiltration through a Teflon (a registered trademark) 0.2-micron filter, thus yielding photocurable compositions of Examples 1 to 4.

Using a spin coater, the composition of each example was coated onto one 6-inch silicon wafer that had been primed with hexamethyldisilazane and one 6-inch glass wafer to form a film of the thickness shown in Table 1 in each case. In order to remove the solvent from the composition, the silicon wafer and the glass wafer were each placed on a hotplate and heated at 100° C. for 2 minutes.

The composition applied to the silicon wafer was irradiated with light having a wavelength of 365 nm at the exposure dose shown in Table 1, through a quartz mask having groups of lines and spaces of equal width with line widths from 1 μm to 50 μm. The exposure was performed using a stepper exposure apparatus NSR-1755i7A manufactured by Nikon Corporation. Following the irradiation, a post-exposure heat treatment was performed at 110° C. for 2 minutes, and the wafer was then cooled.

Subsequently, the coated wafer substrate was dipped in propylene glycol monomethyl ether acetate for 3 minutes to develop the composition. The narrowest line width resolved during the developing is listed in Table 1. Further, the film thickness following developing is also listed in Table 1.

On the other hand, the entire surface of the composition applied to the glass wafer was irradiated directly with light from a high-pressure mercury lamp, without using a quartz mask, using a Mask Aligner MA8 manufactured by SUSS MicroTec AG Following the irradiation, a post-exposure heat treatment was performed, and the composition was then developed by dipping in propylene glycol monomethyl ether acetate. The film that was left following these operations was then heated in an oven for one hour at 180° C., yielding a cured film. This cured film was measured for light transmission of light having a wavelength of 405 nm. The results are shown in Table 2.

Example 5

The composition used in Example 2 was applied to a glass wafer, and subjected to total-surface exposure, post-exposure heating and developing operations in the same manner as described above for Example 2. Subsequently, with the wafer positioned on a hotplate at 140° C., another glass wafer was bonded to the coated surface. Following this operation, the bonded structure was heated in an oven at 180° C. for one hour, yielding a sample composed of a cured film sandwiched between two glass wafers. This sample was placed in an oven at 120° C., and was then irradiated continuously with a 1 mW laser having a wavelength of 406 nm, while the change over time in the light transmission of the sample relative to light having a wavelength of 405 nm was investigated, with the initial transmission deemed to be 100%. The results are shown in FIG. 1.

TABLE 1

|  | Component (A) | Component (B) | Component (C) | Component (D) | Additives | Film thickness after (μm) | Film thickness after developing (μm) | Exposure dose (mJ) | Resolution (μm) |
|---|---|---|---|---|---|---|---|---|---|
| Example 1 | A-1 100 |  | C-1 1 | D-1 50 | E-1 0.1 E-2 0.1 | 9.6 | 9.5 | 600 | 10 |
| 2 | A-1 50 | B-1 50 | C-1 1 | D-1 30 | E-1 0.1 E-2 0.1 E-3 20 | 9.0 | 9.0 | 600 | 10 |
| 3 | A-1 50 | B-2 50 | C-2 1 | D-1 50 | E-1 0.1 E-2 0.1 | 13.3 | 13.2 | 800 | 20 |
| 4 | A-1 50 | B-3 50 | C-2 1 | D-1 60 | E-1 0.1 E-2 0.1 | 9.8 | 9.8 | 800 | 20 |

C-1:

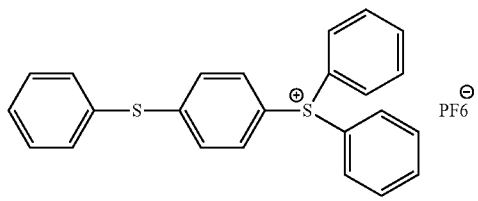

C-2:

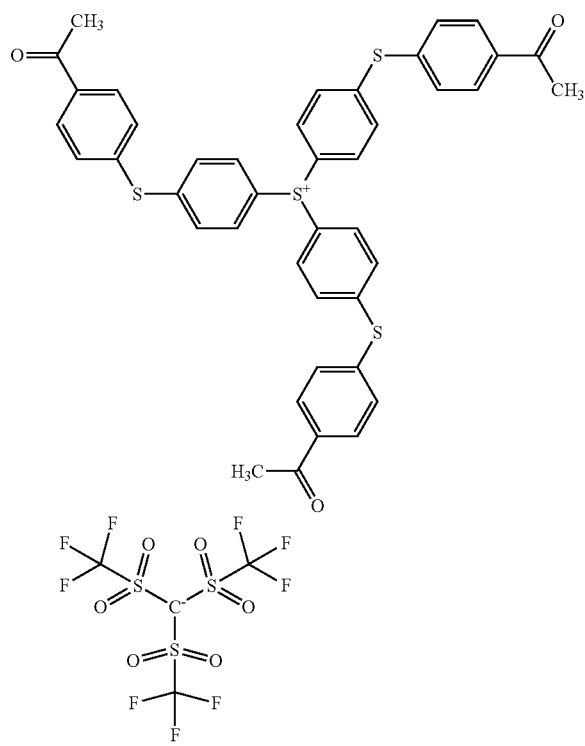

D-1: cyclopentanone
E-1: CHIMASSORB 119FL (manufactured by BASF Japan Ltd.)
E-2: IRGANOX 3114 (manufactured by BASF Japan Ltd.)
E-3:

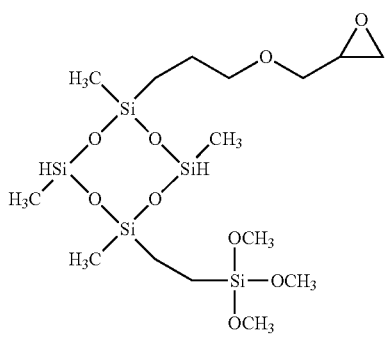

TABLE 2

| | Example 1 | Example 2 | Example 3 | Example 4 |
|---|---|---|---|---|
| Light transmission (%, 405 nm) | 99.9 | 99.7 | 99.1 | 99.2 |

From the above results it was evident that the compositions of Examples 1 to 4 were capable of very fine pattern formation with a line width of approximately 10 to 20 μm, suffered essentially no thickness loss, exhibited satisfactory properties as photosensitive materials, and yielded cured films that exhibited superior light transmission as well as favorable heat resistance and light resistance, meaning the compositions were particularly useful as materials for optical devices.

What is claimed is:
1. A pattern formation method, comprising:
  (i) forming a film of a photocurable composition, comprising:
  (A) a silphenylene having both terminals modified with alicyclic epoxy groups, represented by formula (1) shown below:

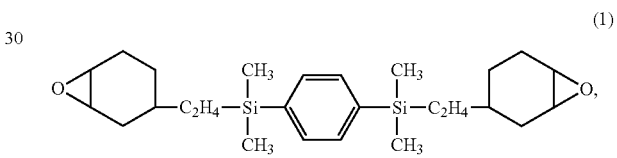

(1)

and
(C) a photoacid generator that generates acid upon irradiation with light having a wavelength of 240 to 500 nm, on a substrate,
(ii) exposing the film through a photomask with light having a wavelength of 240 to 500 nm, or exposing the film through a photomask with light having a wavelength of 240 to 500 nm and then performing heating following the exposure, and
(iii) developing the film in a developing liquid, or developing the film in a developing liquid and subsequently performing post-curing at a temperature within a range from 120 to 300° C.
2. A pattern formation method, comprising:
  (i) forming a film of a photocurable composition, comprising:
  (A) a silphenylene having both terminals modified with alicyclic epoxy groups, represented by formula (1) shown below:

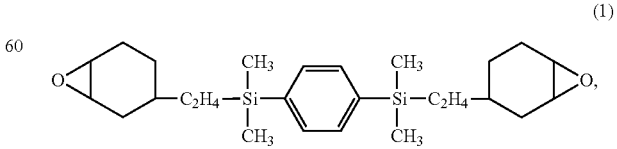

(1)

(B) an epoxy group-containing organosilicon compound represented by general formula (2) shown below:

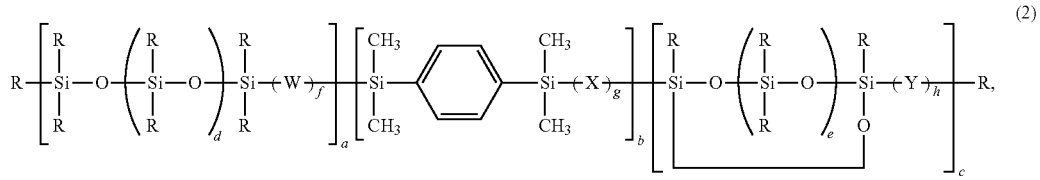

(2)

wherein each R independently represents a hydrogen atom or a monovalent organic group, at least one R comprises an epoxy group, a, b and c each represents an integer of 0 or greater, d represents an integer of 0 or greater, e represents an integer of 1 or greater, W, X and Y each represents a divalent organic group, and f, g and h each independently represents 0 or 1, provided that when a and c are 0, b is 1 and g is 0, the R groups do not both represent epoxy group-containing organic groups represented by the formula below:

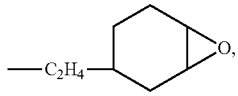

and
(C) a photoacid generator that generates acid upon irradiation with light having a wavelength of 240 to 500 nm, on a substrate, (ii) exposing the film through a photomask with light having a wavelength of 240 to 500 nm, or exposing the film through a photomask with light having a wavelength of 240 to 500 nm and then performing heating following the exposure, and (iii) developing the film in a developing liquid, or developing the film in a developing liquid and subsequently performing post-curing at a temperature within a range from 120 to 300° C.

3. An optical semiconductor element obtained by performing pattern formation using the method defined in claim 1.

4. The optical semiconductor element according to claim 3, having a cured film obtained by curing the photocurable composition.

5. An optical semiconductor element obtained by performing pattern formation using the method defined in claim 2.

6. The optical semiconductor element according to claim 5, having a cured film obtained by curing the photocurable composition.

* * * * *